(12) United States Patent
Tsai et al.

(10) Patent No.: US 7,961,053 B1
(45) Date of Patent: Jun. 14, 2011

(54) INTEGRATED CIRCUIT HAVING A DUMMY TRANSIMPEDANCE AMPLIFIER

(75) Inventors: Huan-Shang Tsai, Cupertino, CA (US); Yong K. Yim, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 12/646,674

(22) Filed: Dec. 23, 2009

(51) Int. Cl.
*H03F 3/08* (2006.01)

(52) U.S. Cl. .................................. 330/308; 250/214 A

(58) Field of Classification Search .................. 330/308; 250/214 A
See application file for complete search history.

(56) References Cited

U.S. PATENT DOCUMENTS

| 6,756,578 | B1 * | 6/2004 | Kaiser | 250/214.1 |
| 6,803,825 | B2 * | 10/2004 | Chiou et al. | 330/308 |
| 6,834,165 | B2 * | 12/2004 | Feng | 398/202 |
| 6,956,439 | B1 * | 10/2005 | Devnath | 330/308 |

* cited by examiner

*Primary Examiner* — Henry K Choe
(74) *Attorney, Agent, or Firm* — David L. Soltz

(57) ABSTRACT

Consistent with the present disclosure, a "dummy" transimpedance amplifier (dummy TIA) is provided on a substrate along with one or more other transimpedance amplifiers (TIAs) that are connected to photodiodes and output voltage signals for further processing. Typically, the dummy TIA is not connected to a photodiode and does not supply a useful output. The dummy TIA, however, is subject to the same processing and temperature variations as the other TIAs and, as a result, the voltage on the dummy TIA inverting input will be the same or substantially the same as that of the other TIAs. Thus, by sensing the dummy TIA inverting input voltage, an appropriate photodiode bias can be obtained without direct measurement of the voltage on the inverting inputs of the other TIAs.

21 Claims, 2 Drawing Sheets

INTEGRATED CIRCUIT HAVING A DUMMY TRANSIMPEDANCE AMPLIFIER

BACKGROUND

In optical communication systems, an optical signal is often supplied to a receiver including diode, such as a photodiode, which converts the optical signal into a corresponding electrical current. The current, in turn, may be supplied to a resistor to supply a corresponding output voltage for further processing by known circuitry.

The photodiode may have relatively high capacitance, as well as impedance. Accordingly, if the resistor has a relatively high resistance, a relatively high voltage can be generated which has a high signal-to-noise ratio. The response of the output voltage, however, can be slow due to coupling with the photodiode capacitance. Alternatively, if the resistor has a relatively small resistance, the magnitude of the output voltage will be reduced and may have a low signal-to-noise ratio.

Thus, conventional optical receivers may often incorporate an operational amplifier (or "opamp") configured as a transimpedance amplifier. The opamp has an input that is coupled to one terminal of the photodiode and receives the photocurrent. The remaining terminal of the photodiode is connected to a fixed potential, for example. In addition, the inverting input is connected to the output of the opamp via a feedback resistor, and the non-inverting input may be coupled to a fixed potential, such as ground. In this configuration, the output voltage of the opamp has a relatively fast response time and is equal to the input current multiplied by the resistance of the feedback resistor.

In order to insure proper operation of an optical receiver, an appropriate bias is applied across the photodiode. This bias is based on a difference between the voltage of the inverting input of the opamp, which, as noted above, is connected to a first photodiode terminal, and the fixed potential supplied to the second photodiode terminal. The voltage of the inverting opamp input, however, can vary with temperature and may vary from one chip to the next due to process variations. Without direct measurement of the inverting opamp input voltage, therefore, the appropriate photodiode bias may be difficult to determine.

Accordingly, a convenient and accurate mechanism for determining the inverting opamp input voltage, and thus, the photodiode bias, is desired.

SUMMARY

Consistent with the present disclosure, an apparatus is provided that comprises a substrate and first and second transimpedance amplifiers provided on the substrate. The first transimpedance amplifier has a first input and the second transimpedance amplifier has a second input. The apparatus also includes a diode having a first terminal and a second terminal, the first terminal being coupled to the first input. In addition, a control circuit is provided that is coupled to the second terminal of the diode and the second input of the second transimpedance amplifier. The control circuit supplies a first voltage to the first terminal of the diode in response to a second voltage, which is a voltage of the second input of the second transimpedance amplifier.

It is to be understood that both the foregoing general description and the following detailed description are exemplary and explanatory only and are not restrictive of the invention, as claimed.

The accompanying drawings, which are incorporated in and constitute a part of this specification, illustrate various embodiments.

DESCRIPTION OF THE EMBODIMENTS

Consistent with the present disclosure, a "dummy" transimpedance amplifier (dummy TIA) is provided on a substrate along with one or more other transimpedance amplifiers (TIAs) that are connected to photodiodes and output voltage signals for further processing. Typically, the dummy TIA is not connected to a photodiode and does not supply a useful output. The dummy TIA, however, is subject to the same processing and temperature variations as the other TIAs, and, as a result, the voltage on the dummy TIA inverting input will be the same or substantially the same as that of the other TIAs. Thus, by sensing the dummy TIA inverting input voltage, an appropriate photodiode bias can be obtained without direct measurement of the voltage on the inverting inputs of the other TIAs.

Reference will now be made in detail to the present exemplary embodiments, an examples of which are illustrated in the accompanying drawings. Wherever possible, the same reference numbers will be used throughout the drawings to refer to the same or like parts. In addition, the terms "voltage", "potential", and "bias" may be used interchangeably herein.

Figure 1:
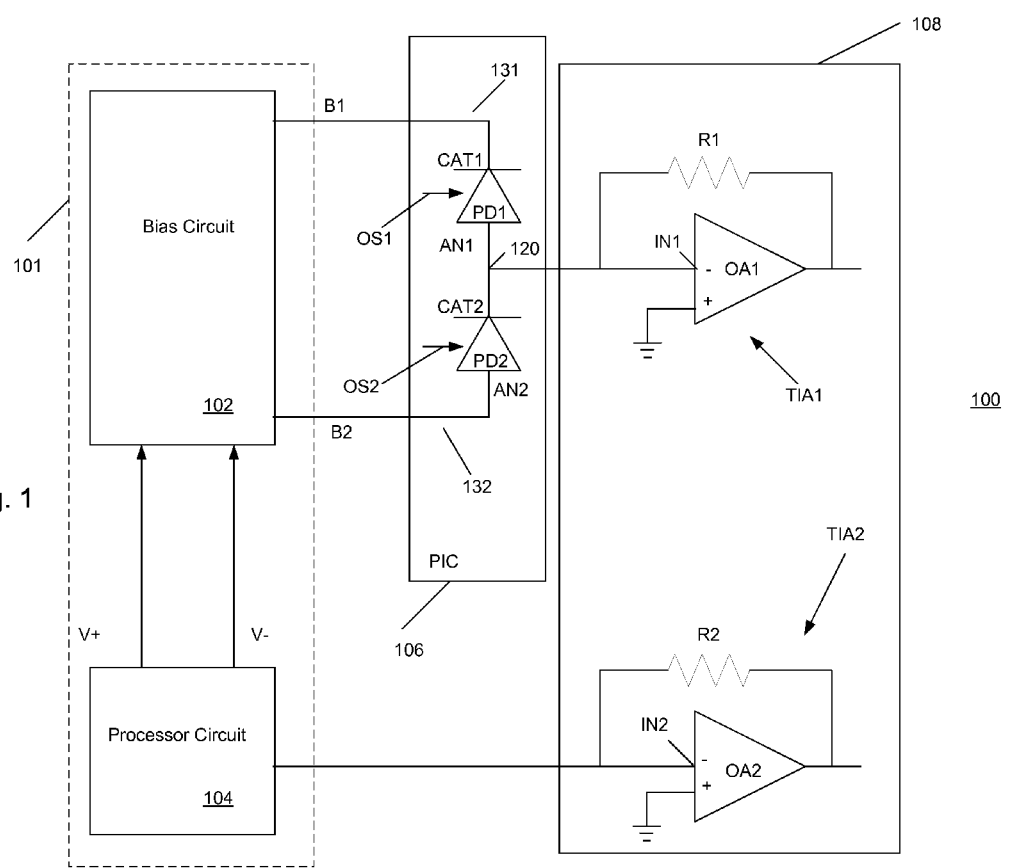
FIG. 1 illustrates a block diagram of a receiver consistent with an aspect of the present disclosure.

FIG. 1 illustrates an example of receiver 100 consistent with an aspect of the present disclosure. Receiver 100 may include a plurality of photodiodes, two of which are shown as photodiodes PD1 and PD2, which receive optical signals OS1 and OS2, respectively. Photodiodes PD1 and PD2 may be provided on an indium phosphide substrate 106, for example, and may constitute part of a photonic integrated circuit (PIC). Exemplary PICs are described in US Patent Application Publication No. 20090238579 and U.S. patent application Ser. No. 12/572,179, the entire contents of both of which are incorporated herein by reference.

Anode AN1 of photodiode PD1 is coupled to cathode CAT2 of photodiode PD2 at node 120, which, in turn, is coupled to inverting input IN1 of opamp OA1. OA1 includes a feedback resistor R1 and has a non-inverting input ("+"), which is coupled to a fixed potential, such as ground. As shown in FIG. 1, OA1 is configured as transmipedance amplifier TIA1.

TIA1 is provided on substrate 108 with a dummy TIA (TIA2), which includes opamp OA2 having a non-inverting input (+) that is coupled to a fixed potential, such as ground. In addition, a feedback resistor R2 connects the output of opamp OA2 with the inverting input IN2. Substrate 108 may include silicon or indium phosphide, for example.

Opamps OA1 and OA2 are both configured as TIAs and are integrated on a common substrate (108). Thus, both will have the same or similar process related variations in the voltages at their respective inverting inputs. Similarly, changes in temperatures will affect both voltages in a similar fashion. Thus, as noted above, the voltage present on inverting input IN2 of opamp OA2 will be the same or substantially the same as the voltage on inverting input IN1 of opamp OA1, and the voltage of IN2 can be used to determine an appropriate bias for photodiodes PD1 and PD2 instead of direct measurement of the voltage on IN1.

In particular, control circuit 101, may be provided to receive the voltage at IN2 and supply biases B1 and B2 to terminals 131 and 132 of diodes PD1 and PD2, respectively, to thereby provide appropriate biasing of these photodiodes. Control circuit 101 includes a processor circuit 104, for example, which determines suitable control voltages V+ and V− based on voltage IN2, the dummy TIA inverting input voltage. Control circuit 101 also includes bias circuit 102, which receives control voltages V+ and V− and generates biases B1 and B2. Bias B1 is supplied to terminal 131, which includes cathode CAT1 of photodiode PD1, and bias B2 is supplied to terminal 132, which includes anode AN2 of photodiode PD2. In the arrangement shown in FIG. 1, photodiodes PD1 and PD2 constitute a balanced photodetector circuit. It is understood that PIC 106 may include a plurality of such balanced photodetector circuits in order to sense a plurality of optical signals, each of which having different wavelengths and/or polarizations. Accordingly, a plurality of TIAs, each of which being coupled to a corresponding balanced photodetector circuit or pair, may also be provided on substrate 108. It is understood that each of such plurality of TIAs has the same or substantially the same structure and function as TIA1.

Thus, biases B1 and B2 are determined based on the non-inverting input voltage at IN2 of dummy transimpedance amplifier TIA2, i.e., the non-inverting input of OA2. As such, a temperatures change, for example, that affects the potential at IN2, also affects the potential at IN1 in the same or similar fashion. Such changes can thus be readily detected to thereby adjust the biases across photodiodes PD1 and PD2 accordingly.

Figure 2:
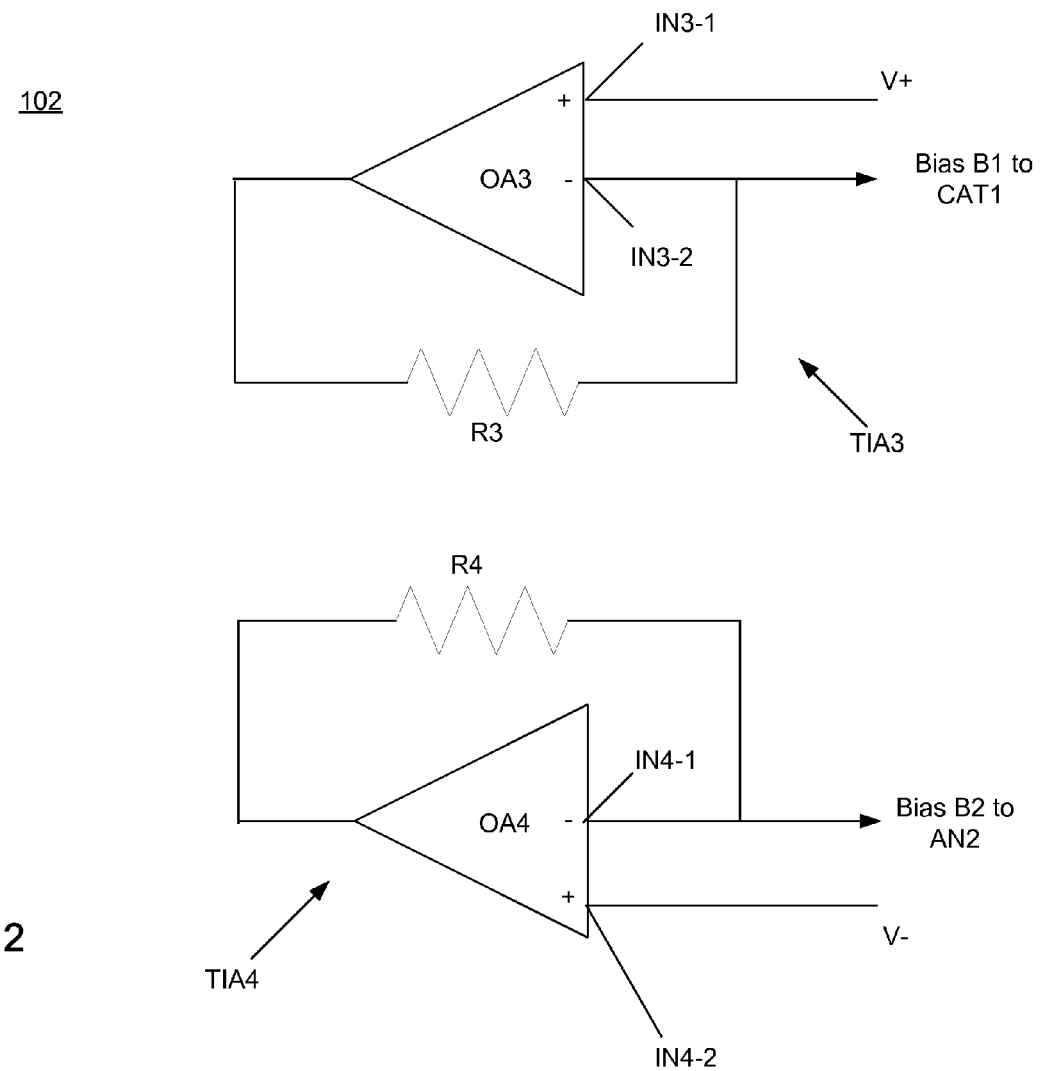
FIG. 2 illustrates an exemplary bias circuit consistent with an additional aspect of the present disclosure.

FIG. 2 illustrates an exemplary bias circuit 102 in greater detail. Bias circuit 102 includes opamps OA3 and OA4, which are configured as transimpedance amplifiers TIA3 and TIA4, respectively. Opamps OA3 and OA4 receive control voltages V+ and V−, respectively, at corresponding inputs IN3-1 and IN4-2. Input IN3-2 is coupled to the output of opamp OA3 via feedback resistor R3. Input IN3-2 is also connected to cathode CAT1 (terminal 131) of photodiode PD1. Opamp OA3 operates in a known manner to set the potential at IN3-2, and thus, the potential on cathode CAT1 (i.e., potential B1) in response to control voltage V+. In one example, the potential at CAT1 may be equal to control voltage V+.

TIA4 is configured and operates in a similar manner as TIA3. Namely, input IN4-1 is coupled to the output of opamp OA4 via feedback resistor R4. Input IN4-1 is also connected to anode AN2 (terminal 132) of photodiode PD1. Opamp OA4 also operates in a known manner to set the potential at IN4-1, and thus, the potential on anode AN2 (terminal 132) in response to control voltage V−. In one example, the potential at anode AN2 (i.e., potential B2) may be equal to control voltage V−.

As noted above, biasing of photodiodes that are connected to a transimpedance amplifier may be determined based on the potential of an input to a dummy transimpedance amplifier, instead of direct measurement, for example. Thus, the photodiodes may be readily biased with an appropriate bias in response to changes in temperature, for example, as well as process variations.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus, comprising:
 a substrate;
 a first transimpedance amplifier provided on the substrate, the first transimpedance amplifier having a first input;
 a second transimpedance amplifier provided on the substrate, the second transimpedance amplifier having a second input;
 a diode having a first terminal and a second terminal, the first terminal being coupled to the first input;
 a control circuit coupled to the second terminal of the diode and the second input of the second transimpedance amplifier, the control circuit supplying a first voltage to the second terminal of the diode in response to a second voltage, the second voltage being a voltage of the second input of the second transimpedance amplifier.

2. An apparatus in accordance with claim 1, wherein the control circuit includes a processor circuit configured to receive the second voltage.

3. An apparatus in accordance with claim 2, further including a bias circuit, wherein the processor circuit supplies a control voltage to the bias circuit, and, in response to the control voltage, the bias circuit outputs the first voltage.

4. An apparatus in accordance with claim 3, wherein the bias circuit includes a third transimpedance amplifier, the third transimpedance amplifier having first and second inputs, the first input receiving the control voltage and the second input being coupled to the first terminal of the diode, the first voltage being generated at the second input of the third transimpedance amplifier.

5. An apparatus in accordance with claim 4, wherein the diode is a first diode, the terminal of the first diode being a first terminal, the apparatus further including a second diode having a second terminal.

6. An apparatus in accordance with claim 3, wherein the control voltage is a first control voltage, the processor circuit further supplying a second control voltage to the bias circuit in response to the second voltage of the second input of the second transimpedance amplifier,
 wherein in response to the second control voltage, the bias circuit supplies a third voltage to the second terminal of the second photodiode.

7. An apparatus in accordance with claim 6, wherein the bias circuit includes a fourth transimpedance amplifier, the fourth transimpedance amplifier having first and second inputs, the first input of the fourth transimpedance amplifier receiving the second control voltage and the second input of the fourth transimpedance amplifier being coupled to the second terminal of the second diode, the third voltage being generated at the second input of the fourth transimpedance amplifier.

8. An apparatus in accordance with claim 5, wherein the substrate is a first substrate, the apparatus further including a second substrate, the first and second photodiodes being provided on the second substrate.

9. An apparatus in accordance with claim 7, wherein the substrate includes indium phosphide (InP).

10. An apparatus in accordance with claim 6, wherein the first terminal of the first diode includes a cathode of the first diode and the second terminal of the second photodiode includes an anode of the second diode.

11. An apparatus in accordance with claim 10, wherein an anode of the first diode and a cathode of the second diode are coupled to one another and to the first input of the first transimpedance amplifier.

12. An apparatus in accordance with claim 11, wherein the first and second diodes are photodiodes configured to receive optical signals.

13. An apparatus in accordance with claim 12, wherein the first and second diodes constitute a balanced photodetector circuit.

14. An apparatus, comprising:
a first operational amplifier having a first input,
a first photodiode and a second photodiode, the first and second photodiodes being coupled to one another at a node, the first input of the first operational amplifier being coupled to the node, the first photodiode having a first terminal and the second photodiode having a second terminal;
a second operational amplifier having a second input;
a control circuit coupled to the second input of the second operational amplifier, wherein a voltage on the second input of the second operational amplifier is indicative of a voltage on the first input of the first operational amplifier, the control circuit supplying first and second biases to the first and second terminals, respectively, in response to the voltage on the second input of the second operational amplifier.

15. An apparatus in accordance with claim 14, wherein the first terminal of the first photodiode includes a cathode of the first photodiode and the second terminal of the second photodiode includes an anode of the second photodiode.

16. An apparatus in accordance with claim 15, wherein an anode of the first diode and a cathode of the second diode are coupled to one another at the node.

17. An apparatus in accordance with claim 15, wherein the first and second photodiodes constitute a balanced photodetector circuit.

18. An apparatus in accordance with claim 14, wherein the first and second operational amplifiers are configured as first and second transimpedance amplifiers, respectively.

19. An apparatus in accordance with claim 14, further including:
a first substrate, the first and second operational amplifiers being provided on the first substrate; and
a second substrate, the first and second photodiodes being provided on the second substrate.

20. An apparatus in accordance with claim 14, wherein the control circuit includes a processor circuit configured to receive the voltage on the second input of the second operational amplifier, the control circuit supplying first and second control voltages in response to the voltage on the second input of the second operational amplifier.

21. An apparatus in accordance with claim 20, further including a bias circuit, wherein the processor circuit supplies the first and second control voltages to the bias circuit, and, in response to the first and second control voltages, the bias circuit outputs the first and second biases, respectively.

* * * * *